United States Patent [19]
Fujii et al.

[11] Patent Number: 5,233,558
[45] Date of Patent: Aug. 3, 1993

[54] SEMICONDUCTOR MEMORY DEVICE CAPABLE OF DIRECTLY READING THE POTENTIAL OF BIT LINES

[75] Inventors: Syuso Fujii, Kawasaki; Takeshi Nagai, Tokyo, both of Japan

[73] Assignee: Kabushiki Kaisha Toshiba, Kawasaki, Japan

[21] Appl. No.: 805,965

[22] Filed: Dec. 12, 1991

[30] Foreign Application Priority Data

Dec. 14, 1990 [JP] Japan ................... 2-402458

[51] Int. Cl.⁵ ............................. G11C 13/00
[52] U.S. Cl. ................. 365/189.01; 365/189.02; 365/203; 365/207
[58] Field of Search ............ 365/189.01, 149, 203, 365/207, 189.02

[56] References Cited

U.S. PATENT DOCUMENTS

| | | | |
|---|---|---|---|
| 4,780,852 | 10/1988 | Kajigawa et al. | 365/203 |
| 4,954,992 | 9/1990 | Kumanoya et al. | 365/189.01 |
| 4,970,688 | 11/1990 | Minagawa et al. | 365/189.01 |
| 4,984,206 | 1/1991 | Komatsu et al. | 365/149 |
| 5,014,246 | 5/1991 | Komatsu et al. | |
| 5,138,578 | 8/1992 | Fujii | 365/149 X |

FOREIGN PATENT DOCUMENTS

| | | |
|---|---|---|
| 3740314 | 6/1988 | Fed. Rep. of Germany. |
| 3939849 | 6/1990 | Fed. Rep. of Germany. |
| 1-169798 | 7/1989 | Japan. |
| 2184309 | 6/1987 | United Kingdom. |

*Primary Examiner*—Eugene R. LaRoche
*Assistant Examiner*—Son Dinh
*Attorney, Agent, or Firm*—Banner, Birch McKie & Beckett

[57] ABSTRACT

Memory cell arrays containing dynamic memory cells and write/read circuits for these memory cell arrays are arranged alternately. In the write/read circuit, read amplifiers are provided at a rate of one for every four columns (bit line pairs). This read amplifier is composed of a preamplifier and a main amplifier. Each column is provided with a multiplexer, which selects a column and connects it to the preamplifier of a read amplifier. The signal amplified by this preamplifier is supplied to the main amplifier. The current-mirror load circuit of this main amplifier is in common use by a plurality of read amplifiers.

22 Claims, 10 Drawing Sheets

SEMICONDUCTOR MEMORY DEVICE CAPABLE OF DIRECTLY READING THE POTENTIAL OF BIT LINES

BACKGROUND OF THE INVENTION

1. Field of the Invention

This invention relates to a semiconductor memory device, and more particularly to a read circuit capable of directly reading the potential of bit lines in a dynamic random access memory (DRAM).

2. Description of the Related Art

In conventional DRAMs, there is a read circuit composed only of a sense amplifier (a flip-flop circuit) for sensing and restoring data. Such a read circuit is slow in read operation. One reason for this is that the latching of the bit-line potential by the sense-restore sense amplifier involves charging and discharging the bit line of a large capacity, resulting in a slow latching action. Another reason is that causing the read gate to open in synchronization with the sense-restore sense amplifier under the control of the column select signal requires a suitable timing.

In this connection, Published Unexamined Japanese Patent Application No. 1-169798 discloses a bit-line potential direct-read circuit, which reads a small signal read on a bit line from a memory cell immediately after a word line is activated without the intervention of the sense-restore sense amplifier. With this circuit, a read operation in a DRAM can be made faster.

FIG. 11 is a schematic diagram of the circuit disclosed in the above application. For each pair of bit lines BL and $\overline{BL}$, there are a sense-restore sense amplifier (a flip-flop circuit FF), a write gate circuit WGT, and a differential read amplifier RA all connected to this bit line pair.

This read amplifier RA is composed of two n-channel metal-oxide silicon field-effect driving transistors (hereinafter, referred to as NMOS transistors) whose respective gates are connected to the bit-line pair, an NMOS transistor for a current source whose gate is supplied with the internal potential $V_{CC}/2$ between the power supply potential $V_{CC}$ and the ground potential $V_{SS}$, and two NMOS transistors for read gates which are connected between the two driving NMOS transistors and a pair of read common data lines O and $\overline{O}$ and are selected by a column select signal CSL. The read common data-line pair O and $\overline{O}$, which is connected to a load circuit LD made up of two p-channel MOS FETs (hereinafter, referred to as PMOS transistors), is in common use by a plurality of read amplifiers RA.

In the bit-line potential direct-read method, it is a common practice to separate the read common data-line pair O and $\overline{O}$ from the write common data-line pair I and $\overline{I}$.

FIG. 12 shows the timing of read operation when the memory cell data in the FIG. 11 circuit is a 0.

When the column select signal CSL is activated to open the read gate and then the word line WL is activated, information in the memory cell MC appears on the pair of bit lines BL and $\overline{BL}$, which is immediately amplified by the read amplifier RA and then transferred to the pair of common read data lines O and $\overline{O}$. This allows data to be read mostly as fast as the static RAM (SRAM). Next, the activating signals $\overline{SAN}$ and SAP for the sense-restore sense amplifier are activated to enable this sense amplifier SA, which in turn performs a latch action that amplifies the signal on the pair of bit lines BL and $\overline{BL}$, or the previously read information, and rewrites it into the memory cell MC. The sense amplifier SA only amplifies and rewrites the signal, so that its operating speed has no effect on the reading speed.

With the conventional bit-line potential direct-read circuit, however, the pattern layout of the integrated circuit makes it difficult to provide the read amplifier RA with a sufficient sensitivity or an amplification factor with less variations. It is desirable that numerous MOS transistors constituting the read amplifiers RA are arranged symmetrically in the direction in which the bit line pair extends. However, squeezing the patterns within the pitch between the pair of bit lines leads to an increased chip size or an imbalanced parasitic resistance.

The most serious problem with such conventional circuits is that high-speed reading cannot be expected especially when a signal to be amplified is small. The reason for this is that a considerable parasitic capacitance of the order of several pF generally existing on the pair of read common data lines O and $\overline{O}$ makes it difficult for only a single stage of read amplifier RA to amplify a very small input signal under the worst conditions where the potential difference is on the order of 200 mV. In other words, with the conventional bit-line potential direct-read circuit, reading speed varies substantially depending on the magnitude of input signal.

SUMMARY OF THE INVENTION

The object of the present invention is to provide a semiconductor memory device capable of reading information at a high speed even when the level of a signal read on the line pair from a DRAM cell is small, while maintaining a high sensitivity by suppressing variations in reading speed.

The foregoing object is accomplished by providing a semiconductor memory device comprising: a memory cell array in which dynamic memory cells are placed at some of the intersections of a plurality of bit line pairs and a plurality of word lines; a row decoder for selecting a word line of the memory cell array; a column decoder for supplying a column select signal to select a column (a bit line pair) of the memory cell array; bit-line precharge equalize circuits connected to the individual columns of the memory cell array, respectively, which, based on a precharge equalize signal, precharge and equalize the bit line pair to a specified potential for a particular period of time; restore sense amplifiers connected to the individual columns of the memory cell array, respectively, which restore information in the memory cell; write gate circuits provided for the individual columns of the memory cell array, respectively, which are each selected by a column select signal from the column decoder; a write data line pair connected in common to the write gate circuits, which transfers information to be written; a plurality of read amplifiers provided at a rate of one for every particular number of columns of the memory cell array, each of which is composed of a plurality of differential amplifiers connected in cascade; a read data line pair connected in common to the individual final-stage output sections of the read amplifiers; a multiplexer that, based on a column select signal from the column decoder, selects one of the columns and then connects it to a corresponding read amplifier; a first precharge circuit connected to the output side of the multiplexer, which is selectively turned on by a first precharge signal, and precharges the signal line pair on the output side of the multiplexer to a specified potential during the time other than read operations; a control signal generating circuit the output terminal of which is connected to the first precharge circuit and the read amplifier, and which, according to the column select signals, not only selectively deactivates the first precharge signal, but also produces a control signal to activate the read amplifier; and a read amplifier activating circuit provided for the read amplifier, which, based on the control signal from the control signal generating circuit, activates the read amplifier.

In the present invention, the read amplifier is composed of two stages of amplifiers with the first amplifier having a small load capacity. This two-stage amplification provides a sufficiently high response characteristics even when a signal to be amplified is small. Therefore, compared with conventional DRAMs with only one stage of read amplifier, the present invention has a sufficiently large sensitivity or amplification factor, which reduces variations in the reading speed due to the magnification of input signal, thereby ensuring high-speed reading In addition, the read amplifiers are provided at a rate of one for every plural number of columns. Therefore, compared with a case where a read amplifier is placed for each column, the present invention allows more space for the installation of read amplifiers, thereby facilitating the layout of circuit patterns. This easiness in laying out circuit patterns helps create a highly symmetrical layout with respect to the direction in which the bit line pair extends.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Referring to the accompanying drawings, embodiments of the present invention will be explained.

Figure 1:
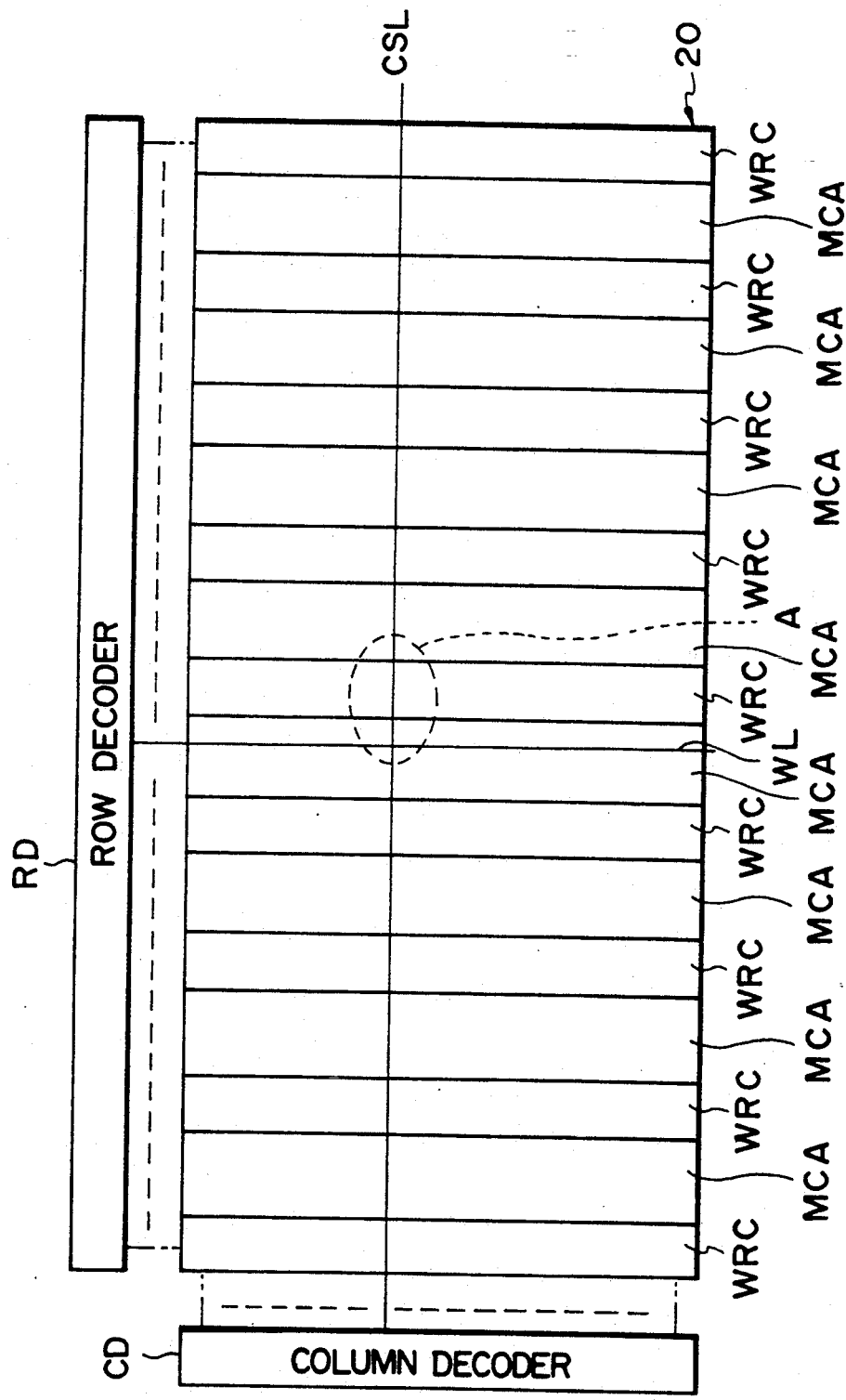
FIG. 1 shows a schematic pattern layout of a portion of a DRAM according to the present invention.

FIG. 1 illustrates schematically the pattern layout of the memory circuit region of a DRAM. In the figure, the memory circuit region 20 is formed on a semiconductor substrate (not shown). In the memory circuit region 20, a plurality of memory-cell arrays MCA and a plurality of write/read circuit regions WRC are arranged alternately. A row decoder is provided along one longitudinal side of the alternate arrangement of the memory cell arrays MCA and write/read circuit regions WRC, whereas a column decoder CD is provided along one lateral side of the same arrangement.

Figure 2:
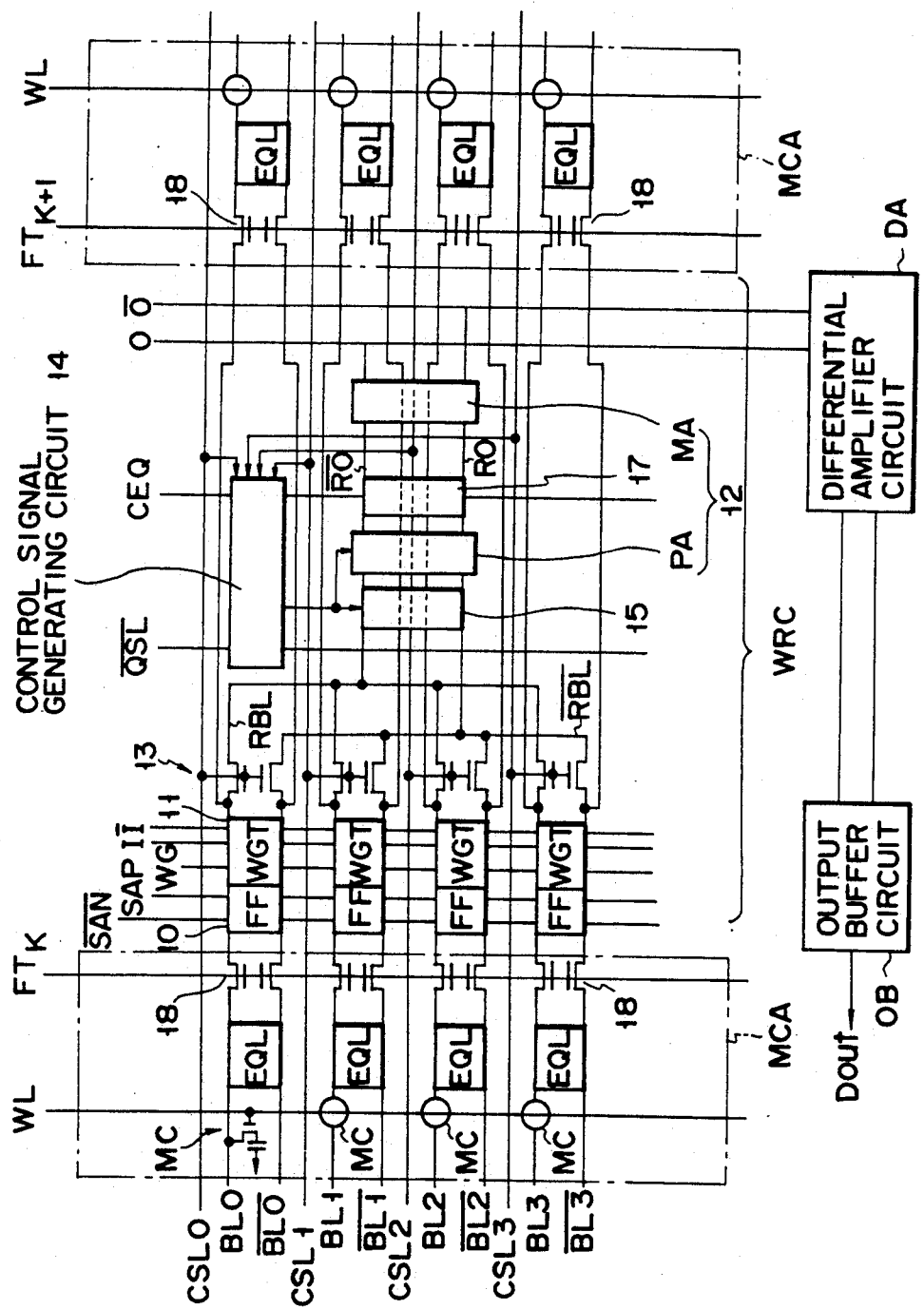
FIG. 2 is a schematic block diagram of a portion of the DRAM of FIG. 1, which is a first embodiment of the present invention.

FIG. 2 is a detailed view of portion A in FIG. 1, schematically illustrating a DRAM with a bit-line potential direct-read circuit according to a first embodiment of the present invention. For the sake of simplification, memory cells, bit line pairs, word lines, and others shown here are limited to the necessary minimum for understanding the present invention.

In FIG. 2, in a memory cell array MCA, a plurality of pairs of bit lines BLO and $\overline{BLO}$ through BL3 and $\overline{BL3}$ and a plurality of word lines WL are arranged so as to cross at right angles and dynamic memory cells MC or dummy cells (not shown) are installed at some of the intersections. Each of these memory cells MC and dummy cells is normally composed of a transistor and a capacitor. One of the word lines is selected by the row decoder RD, while one of the pairs of bit lines BLi and $\overline{BLi}$ (i=0, 1, 2, . . . ) is selected by the column decoder CD. To each column of the memory cell arrays, or each bit line pair, a bit-line precharge equalize circuit EOL is connected which precharges and equalizes the bit line pair for specified period of time according to a precharge equalize signal (not shown). The precharge equalize circuit EQL brings the bit line pair to the precharge potential VBL, which is normally an intermediate potential, such as $V_{CC}/2$, between the power supply potential $V_{CC}$ of the DRAM and the ground potential $V_{SS}$.

Figure 3:
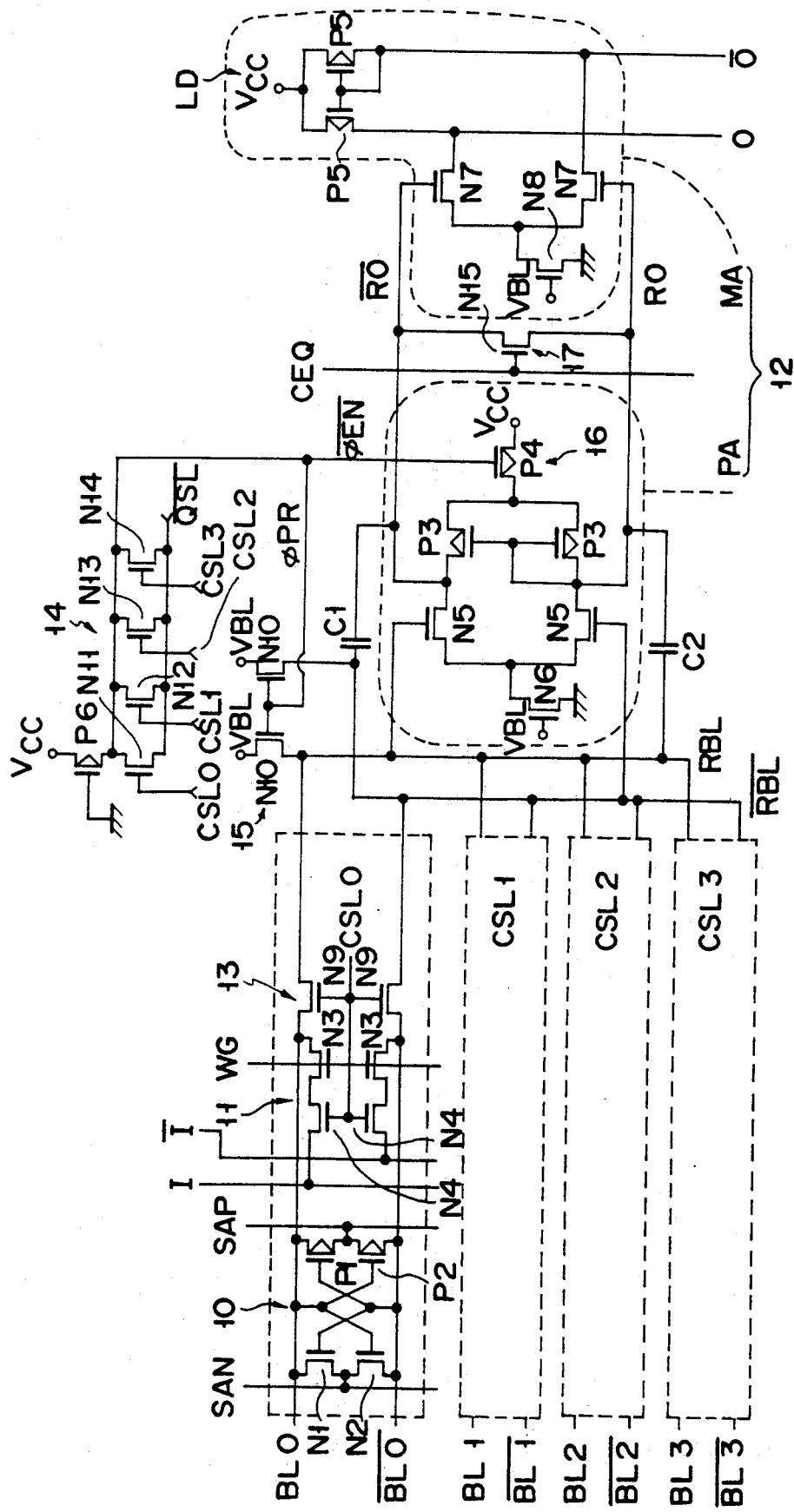
FIG. 3 is a circuit diagram for a concrete example of a portion of the FIG. 2 DRAM.

The write/read circuit WRC is provided with a plurality of latch restore sense amplifiers (FF) 10, write gate circuits (WGT) 11, read amplifier 12, multiplexers 13, first precharge circuits 15, control signal generating circuits 14, read amplifier activating circuits 16 (each included in the first stage amplifier PA of the read amplifier 12 as shown in FIG. 3), and first equalize circuits 17 as well as restore sense amplifier activating signal lines $\overline{SAN}$ and SAP, a write control signal line WG, a pair of write-only common data lines (hereinafter, referred to as a common write bus) I and $\overline{I}$, a block select signal line $\overline{QSL}$, an equalize signal line CEQ, and a pair of read-only common data lines (hereinafter, referred to as a common read bus) O and $\overline{O}$.

The memory cell array MCA and write/read circuit WRC are also provided with column select signal lines CSL0 through CSL3.

The common read bus O and $\overline{O}$ is connected to at least one stage of differential amplifier circuit DA that amplifies a signal read on the bus. The differential amplifier DA is connected to an output buffer OB, which supplies the output signal Dout.

Two blocks of memory cell array regions MCA located on both sides of the write/read circuit WRC share the read amplifier 12 of this intervening write/read circuit WRC. A signal write/read circuit WRC and a single memory cell array region MCA are assumed to form one block. The read amplifier 12 contains a plurality of MOS transistors 18, which connect to the read amplifier 12 the bit-line pairs belonging to one of the two blocks of memory cell array regions MCA. These MOS transistors 18 are controlled by the memory cell array select signal FTk or FTk+1 that selects a particular memory cell array.

Each column of the memory cell arrays is connected to its own restore sense amplifier 10 and write gate circuit 11. The common write bus I and $\overline{I}$ is connected in common to a plurality of write gate circuits 11 in the unit block. The read amplifiers 12 are provided at a rate of one for every plural number of columns of memory cell arrays. Here, one amplifier is placed for every four columns, but they may be provided at a rate of one for every two or eight columns. The read amplifier 12 is composed of, for example, a first stage of differential amplifier (preamplifier) PA and a second stage of differential amplifier (main amplifier) MA.

The common read bus O and $\overline{O}$ is connected in common to the final stage output sections of 64 read amplifiers 12, for example. Based on the column select signal CSLi (i=0, 1, 2, 3, ... ) supplied from the column decoder, the multiplexer 13 selects one out of four columns (bit line pairs) and then connects it to a corresponding read amplifier 12. The first precharge circuit 15, based on a first precharge signal $\phi$PR explained later, precharges the common bit line pair RBL and $\overline{RBL}$ on the output side of the multiplexer 13 to, for example, a potential of $V_{CC}/2$ during the time other than read operations.

The control signal generating circuit 14 is supplied with a block select signal $\overline{QSL}$ and column select signals CSL0 through CSL3 corresponding to the four columns. Based on these signals, the control signal generating circuit 14 brings the first precharge circuit 15 to the off state and generates a control signal to activate the read amplifier 12. The block select signal $\overline{QSL}$, which is generated from the output or input of the row decoder RD, is used to select the write/read circuits WRC in blocks from those contained in the numerous blocks.

The read amplifier activating circuit 16 of FIG. 3, based on a read amplifier activating signal $\overline{\phi EN}$, selectively activates some of the read amplifiers 12 in the block. This activating circuit 16 is provided to prevent current from passing through the read amplifier 12 when it is not selected.

During the time other than read operations, the first equalize circuit 17 selectively equalizes the potential of the complementary signal line pair RO and $\overline{RO}$ between the preamplifier PA and the main amplifier MA of the read amplifier 12. This circuit 17, which is controlled by a first equalize signal CEQ, is provided as required.

FIG. 3 shows a concrete example of the restore sense amplifier 10, write gate circuit 11, read amplifier 12, multiplexer 13, control signal generating circuit 14, first precharge circuit 15, read amplifier activating circuit 16, and first equalize circuit 17.

Specifically, the restore sense amplifier 10 is a complementary MOS (CMOS) flip-flop circuit made up of two NMOS transistors N1 and N2 and two PMOS transistors P1 and P2. The sources of the two NMOS transistors N1 and N2 are both connected to the restore sense amplifier control signal line $\overline{SAN}$ to control the restore sense amplifier, while their drains are connected to the bit lines BLi and $\overline{BLi}$, respectively. The sources of the two PMOS transistors P1 and P2 are both connected to the restore sense amplifier control signal line SAP, while their drains are connected to the bit lines BLi and $\overline{BLi}$, respectively.

The write gate circuit 11 is composed of a write gate pair consisting of two NMOS transistors N3 and a transfer gate pair consisting of two NMOS transistors N4. The current paths of the two NMOS transistors N3 are connected, at one end, to the bit line pair BL0 and $\overline{BL0}$, respectively, whereas their gates are both connected to the write control signal line WG. The current paths of the two NMOS transistors Nr are connected, at one end, to the other ends of current paths of the NMOS transistors N3, respectively, while the other ends are connected to the common write bus I and $\overline{I}$, respectively. The gates of these NMOS transistors N4 are supplied with the column select signal CSL0.

The multiplexer 13 is made up of a transfer gate pair consisting of two NMOS transistors N9. The current paths of these NMOS transistors N9 are connected, at one end, to the bit lines BL0 and $\overline{BL0}$, respectively. Their gates are supplied with the column select signal CSL0. The other end of the current path of the NMOS transistor N9 connected to bit line BL0 is connected to the common bit line pair RBL, while the other end of the current path of the NMOS transistor N9 connected to bit line $\overline{BL0}$ is connected to the common bit line pair $\overline{RBL}$.

Each of the remaining columns is constructed in the same manner in terms of the restore sense amplifier 10, write gate circuit 11, and multiplexer 13.

The common bit line pair RBL and $\overline{RBL}$ is provided with the first precharge circuit 15 to precharge the output side of the multiplexer 13 in order to prevent the output potential from being indefinite when the multiplexer is not selected. The first precharge circuit 15 is composed of two NMOS transistors N10. The current paths of these NMOS transistors are connected, at one end, to the power supply VBL, whereas the other ends are connected the common bit line pair RBL and $\overline{RBL}$, respectively. The gates of the NMOS transistors N10 are supplied with a first precharge signal $\phi$PR from the control signal generating circuit 14.

The control signal generating circuit 14 is made up of four NMOS transistors N11 through N14 and a PMOS transistor P6. The current paths of the NMOS transistors N11 through N14 are connected in parallel with each other and the current path of the PMOS transistor P6 is connected between one end (the output end) of this parallel connection and the power supply $V_{CC}$. The gate of the PMOS transistor P6 is connected to the ground. The gates of the NMOS transistors N11 through N14 are supplied with column select signals CSL0 through CLS3 corresponding to four columns, respectively, while the other ends of the parallel current paths are supplied with the block select signal $\overline{QSL}$. The control signal generating circuit 14 forms a logic circuit that ANDs the OR of column select signals CSL0 through CLS3 with the block select signal $\overline{QSL}$. In this logic circuit, when the logical conditions are not met, the control signal output goes to a high level, whereas when they are met, it goes to a low level. In the present embodiment, this control signal output is used as a read amplifier activating signal $\overline{\phi EN}$ as well as the first precharge signal $\phi PR$. In this case, the high-level control signal output indicates the active state of the first precharge signal $\phi PR$ and the inactive state of the read amplifier activating signal $\overline{\phi EN}$, and the low-level control signal output represents the inactive state of the first precharge signal $\phi PR$ and the active state of the read amplifier activating signal $\overline{\phi EN}$.

The read amplifier 12 is composed of a preamplifier PA and a main amplifier MA, each of which consists of a CMOS differential amplifier with a current-mirror load. In this read amplifier 12, the gate of a MOS transistor is used so as to provide the differential input section of the preamplifier PA with a high impedance, thereby preventing the destruction of a small signal read on the bit lines. The preamplifier PA is connected to the read amplifier activating circuit 16. The load circuit LD of the main amplifier MA is in common by a plurality of read amplifiers in the block.

Specifically, the preamplifier PA is composed of two NMOS transistors N5 and an NMOS transistor N6 constituting a current source, and two PMOS transistors P3 constituting a current-mirror load. The gates of both NMOS transistors N5 are connected to the common bit lines RBL and $\overline{RBL}$, respectively, while their sources are connected to the ground via the NMOS transistor N6. The gate of the NMOS transistor N6 is supplied with the intermediate potential VBL. The drains of both NMOS transistors N5 are connected to the drains of the PMOS transistors P3, respectively, with the drain of one NMOS transistor N5 being connected to the gates of both PMOS transistors P3. Between the sources of the PMOS transistors P3 and the potential $V_{CC}$, a PMOS transistor P4 is connected which serves as the read amplifier activating circuit 16. The gate of the PMOS transistor P4 is supplied with a read amplifier activating signal $\overline{\phi EN}$.

The main amplifier MA is composed of two NMOS transistors N7, a NMOS transistor N8 for current source, and two PMOS transistors P5 constituting a current-mirror load. The gates of both NMOS transistors N7 are connected, via the complementary signal lines RO and $\overline{RO}$, to the drains of both NMOS transistors N5, respectively. The sources of the NMOS transistors N7 are connected to the ground via the NMOS transistor N8. The gate of the NMOS transistor N8 is supplied with the intermediate VBL. The drains of both NMOS transistors N7 are connected to the drains of the PMOS transistors P5, respectively, with the drain of one NMOS transistor N7 being connected to the gates of both PMOS transistors P5. The sources of these PMOS transistors P5 are connected to the potential $V_{CC}$. The drains of the PMOS transistors P5 are connected to the common read bus O and $\overline{O}$, respectively, for common use by a plurality of read amplifiers 12, thereby suppressing an increase in the pattern size.

Between the common bit line $\overline{RBL}$ and the drain of one NMOS transistor N5 constituting the preamplifier PA, a capacitor C1 is connected, whereas between the common bit line RBL and the drain of the other NMOS transistor N5 constituting the preamplifier PA, a capacitor C2 is connected. Since these capacitors C1 and C2 have the function of reducing a parasitic capacitance between the common bit lines RBL and $\overline{RBL}$ and the output terminal of the preamplifier PA, they prevents the signals on the common bit lines RBL and $\overline{RBL}$ from decreasing due to coupling noises introduced by the parasitic capacitance.

Although the PMOS transistors P5 are used as the load circuit of the main amplifier MA, it may be a high-resistance load instead.

The first equalize circuit 17 is composed of an NMOS transistor N15 connected across the signal line pair RO and $\overline{RO}$. The gate of this NMOS transistor N15 is supplied with a first equalize signal CEQ. The first equalize circuit 17 may be a CMOS transfer gate consisting of a parallel connection of an NMOS transistor and a PMOS transistor controlled by complementary equalize signals.

Additionally, a circuit that precharges the signal line pair RO and $\overline{RO}$ to an appropriate level, for example, $V_{CC}/2$ may be provided so as to be turned on by the first equalize signal CEQ. That is, a first precharge equalize circuit may be used in place of the first equalize circuit 17.

Figure 4:
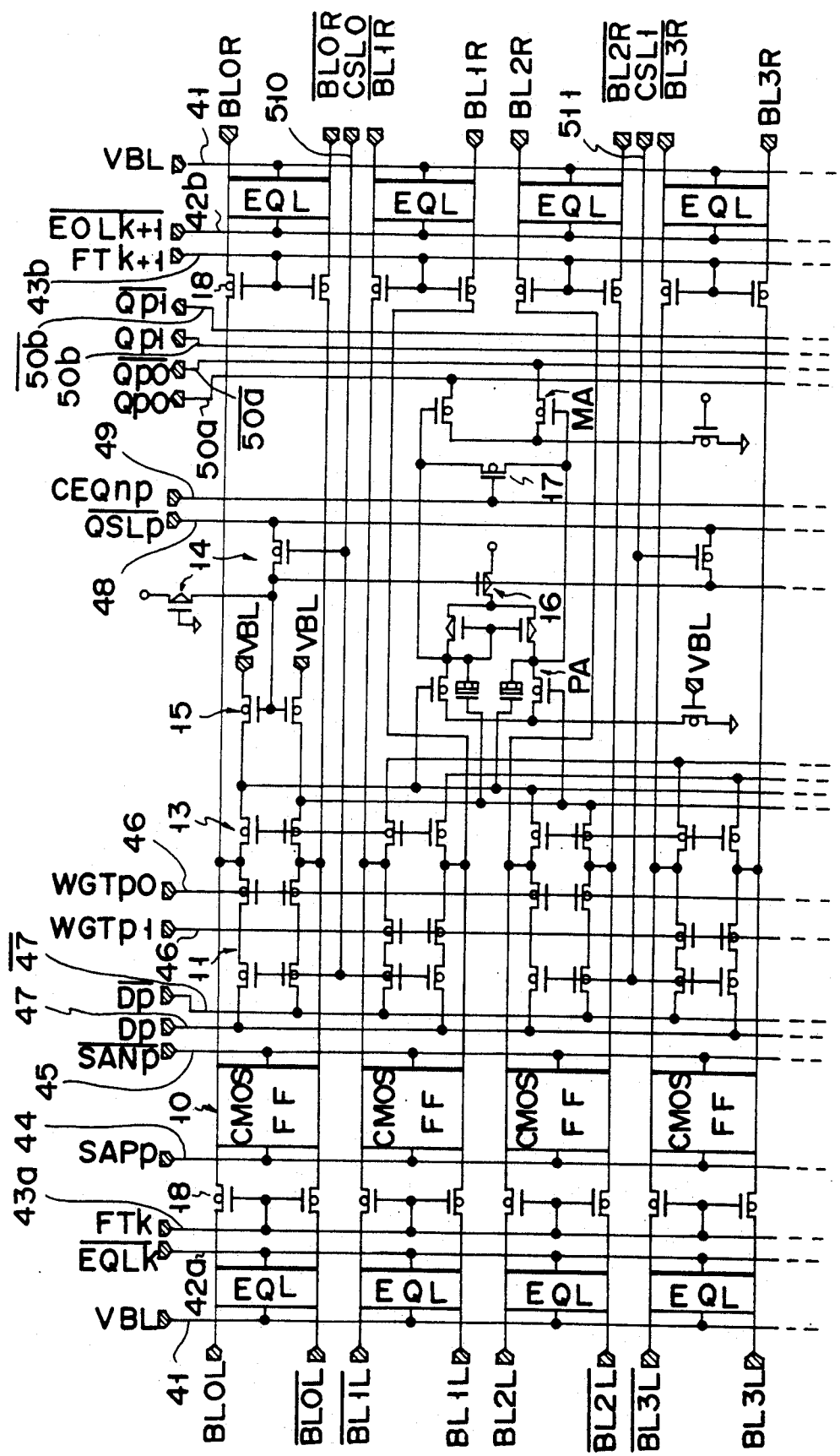
FIG. 4 is a detailed circuit diagram of a portion for bit 0 to bit 3 of the FIG. 2 DRAM in accordance with the pattern layout.
Figure 5:
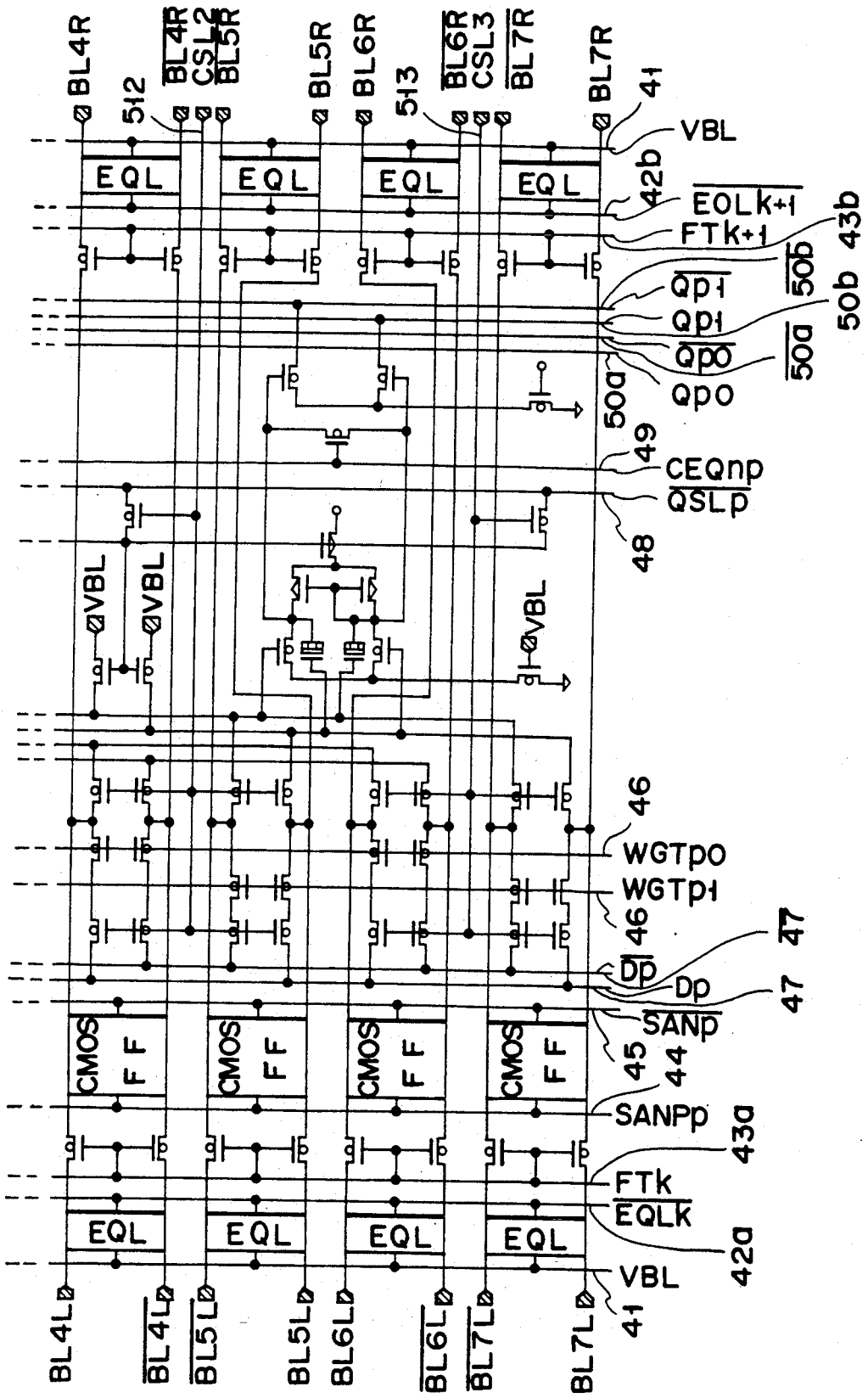
FIG. 5 is a detailed circuit diagram of a portion for bit 4 to bit 7 of the FIG. 2 DRAM in accordance with the pattern layout.

FIGS. 4 and 5 are detailed circuit diagrams for eight columns of the memory circuit region 20 of FIG. 1, corresponding to the pattern layout, with the like parts in FIG. 2 being assigned the same reference characters as those in FIG. 2.

Here, provided in parallel with the word line WL are: a bit-line precharge power line 41, bit-line precharge equalize signal lines 42a and 42b, signal lines 43a and 43b for selective control of a plurality of MOS transistors 18, restore sense amplifier activating signal lines 44 and 45, a write control signal line 46, common write bus 47 and $\overline{47}$, a block select signal line 48, an equalize signal line 49, common read buses 50a and $\overline{50a}$, and 50b and $\overline{50b}$.

The column select signal line 51i is provided in parallel with the bit line pair BLi and $\overline{BLi}$.

Read operation in the DRAM of the first embodiment will be described, referring to FIG. 6.

It is assumed that the timing with which the read amplifier 12 is activated is before or at the same time the word line WL is activated, that the timing with which the first equalize circuit 17 is switched from on to off is at the same time or immediately after the word line WL is activated, and that the timing with which the restore sense amplifier 10 is activated is at the same time of or later than the first equalize circuit 17 is turned off.

Before a read operation starts, the bit-line pair BLi and $\overline{BLi}$ and the common bit-line pair RBL and $\overline{RBL}$ on the multiplexer output side are precharged to the potential $V_{CC}/2$. First, for example, when the column select signal CSL0 and block select signal QSL are each activated, the first precharge signal $\phi PR$ goes to the inactive state and the read amplifier activating signal $\overline{\phi EN}$ goes to the active state, which activates the read amplifier 12 corresponding to the column to be selected by the column select signal CSLO. At the same time or after this, the bit-line precharge equalize circuit EQL is turned off and the output of the row decoder RD selectively activates the word line WL, thereby causing the information in the memory cell MC connected to the selected word line WL to be read on the respective bit lines BL0 and $\overline{BL0}$. With the read amplifier 12 already in the active state, a small signal appears on the bit line pair BL0 and $\overline{BL0}$ is amplified immediately. An actual read operation starts with switching the first equalize circuit 17 from on to off state almost at the same time or later than the word line is activated.

To read at a high speed a signal appearing on the bit line, it is important to activate the read amplifier 12 before the activation of the word line WL. In this case, if there is imbalance in the potential difference at the signal line pair RO and $\overline{RO}$ between the preamplifier PA and main amplifier MA of the read amplifier 12 before the signal read from the memory cell appears on the bit lines, this imbalance component is also amplified at the read amplifier 12. Therefore, the amplification of the signal on the bit lines read from the memory cell requires the inversion of erroneous data caused by such imbalance, which makes a hindrance to high-speed reading.

To eliminated this drawback, the first equalize circuit 17 is used which equalizes the signal line pair RO and $\overline{RO}$ between the preamplifier PA and the main amplifier MA. That is, by switching the first equalize circuit 17 from on to off at the same time of or later than the activation of the word line, high-speed read operation can be assured.

The input to the read amplifiers not selected is precharged to $V_{CC}/2$ by the first precharge circuit 15. Therefore, the output of the preamplifier PA never fails to be at a low level and the main amplifier MA is in the off state, which not only prevents current from flowing through the NMOS transistor N7, but also separates this transistor, or the read amplifier, from the common read bus O and $\overline{O}$.

Then, to rewrite a signal appearing on the bit lines into the memory cell, the restore sense amplifier 10 performs a restore action. Specifically, when the restore-sense amplifier control signal SAN changes from $V_{CC}/2$ to the low level (the potential $V_{SS}$) and the restore sense control signal SAP goes from $V_{CC}/2$ to the high level (the potential $V_{CC}$), a restore operation starts on the bit lines and then a signal appearing on the bit lines is rewritten into the memory cell.

Now, a write operation in the DRAM of the first embodiment will be described.

Write operations here are almost the same as those in ordinary DRAMs. Specifically, before the start of operation, the individual bit line pairs are precharged to $V_{CC}/2$. When the word line selected by the row decoder RD is activated, information stored in the memory cell MC is read onto the bit lines. When a column select signal, for example, CSLO, selects a corresponding write gate circuit 11 and the write control signal WG is activated, the common write bus I and $\overline{I}$ is selectively connected to the bit line pair BLO and $\overline{BLO}$, respectively, thereby allowing data to be placed on the bit line pair BLO and $\overline{BLO}$. After this, the restore sense amplifier 10 operates to write the data into the selected memory cell.

In the DRAM of the first embodiment, the read amplifier 12 is composed of two stages of amplifiers, the preamplifier PA and main amplifier MA, with the preamplifier PA having a small load capacity. This configuration provides sufficient response characteristics even when the signal to be amplified is at a low level. Thus, compared with conventional DRAMs with a single stage of read amplifier, the first-embodiment DRAM provides a sufficiently high sensitivity or amplification factor, which reduces variations in the reading speed due to the magnitude of the input signal, thereby assuring high-speed reading.

Figure 6:
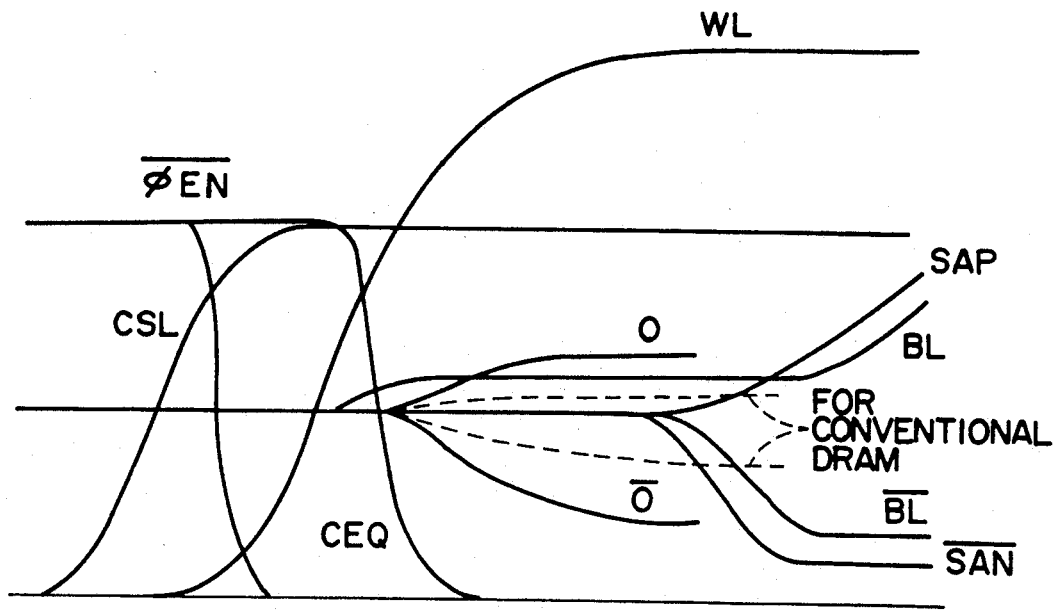
FIG. 6 is a timing diagram for a read operation in the DRAM of FIG. 2.

The potential variations shown by dotted lines in FIG. 6 indicate the characteristics of the common read bus O and $\overline{O}$ during read operation in a conventional DRAM. When the DRAM of the first embodiment was actually applied to a 4-Mbit DRAM, access times as fast as on the order of 17 ns could be achieved.

In the first-embodiment DRAM, the read amplifiers 12 are provided at a rate of one for every four columns. Therefore, compared with an arrangement in which a read amplifier is provided for each column, this arrangement allows more space for the installation of read amplifiers 12, making it easy to lay out the circuit pattern. Because the input signal level of the preamplifier PA is limited, it is desirable to have the elements of the preamplifier PA with similar characteristics (electrical characteristics). To achieve this, it is important to make the pattern of elements used as symmetrical as possible. In the present embodiment, because each read amplifier is placed in the region of four pitches of bit-line pairs, this facilitates the layout of the circuit pattern, thereby making it possible to obtain as symmetrical a layout as possible with respect to the bit-line pair. Because the read amplifiers are provided at a rate of one for every four columns, the number of elements per column is not increased as expected, resulting in a less increase in the pattern size.

Because the number of amplifiers, or the number of drains of the MOS transistors, connected to the common read bus is smaller than that of conventional DRAMs where each column has its own read amplifier, the parasitic capacitance of the common read bus O and $\overline{O}$ can be reduced. Therefore, the common read bus can be driven at a high speed by using the read amplifiers. That is, according to the DRAM of the first embodiment, even when the level of a signal read onto the bit line pair from the memory cell is small, high-speed read operations can be achieved, suppressing variations in the reading speed.

If, in the first-embodiment DRAM, an imbalance in the potential difference occurs on the common read bus O and $\overline{O}$ before the signal read from the memory cell appears on the bit line pair, this has an adverse effect on high-speed reading. To avoid this problem, a second equalize circuit is provided which selectively equalizes the potential of the common read bus O and $\overline{O}$. By switching the second equalize circuit from on to off state at the same time of or immediately after the activation of the word line, and in synchronization with or slightly later than the operation of the first equalize circuit, high-speed reading can be assured.

Figure 7:
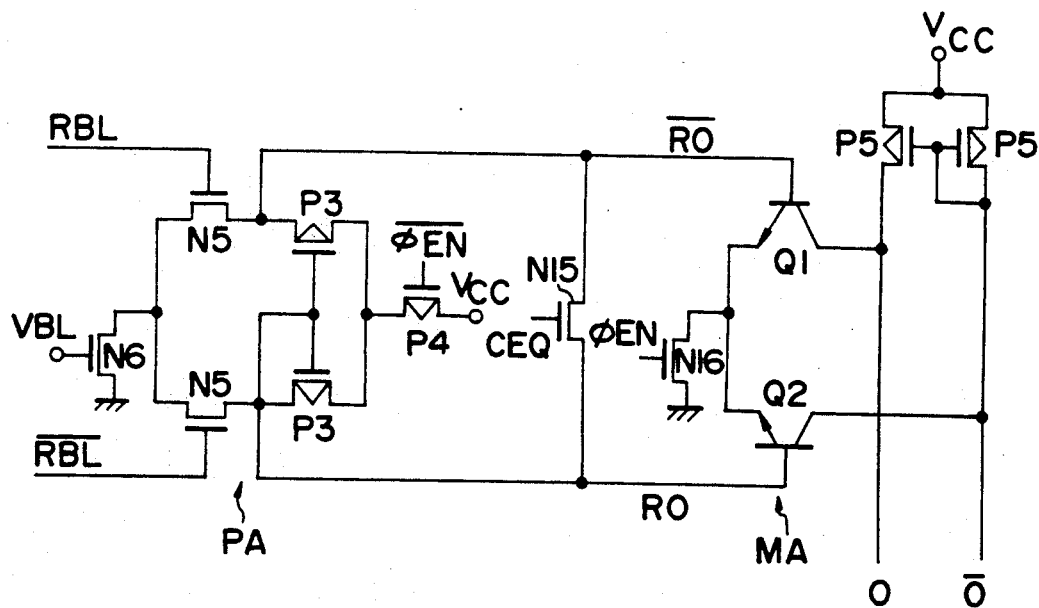
FIG. 7 is a circuit diagram for a modification of the read amplifier of FIG. 4.

FIG. 7 shows a modification of the read amplifier 12 of FIG. 3. In the figure, the construction of the preamplifier PA is the same as that of FIG. 3. The main amplifier MA is composed of a bipolar MOS differential amplifier consisting of a bipolar transistor and a MOS transistor. Specifically, the collectors of n-p-n driving transistors Q1 and Q2 are connected to the common read bus O and $\overline{O}$ and also to PMOS transistors P5 serving as a load, with their emitters connected to the ground via an NMOS transistor N16. The gate of this NMOS transistor N16 is supplied with an inverted activating signal $\phi$EN. Reference character N15 indicates an NMOS transistor acting as the first equalize circuit 17.

Figure 8:
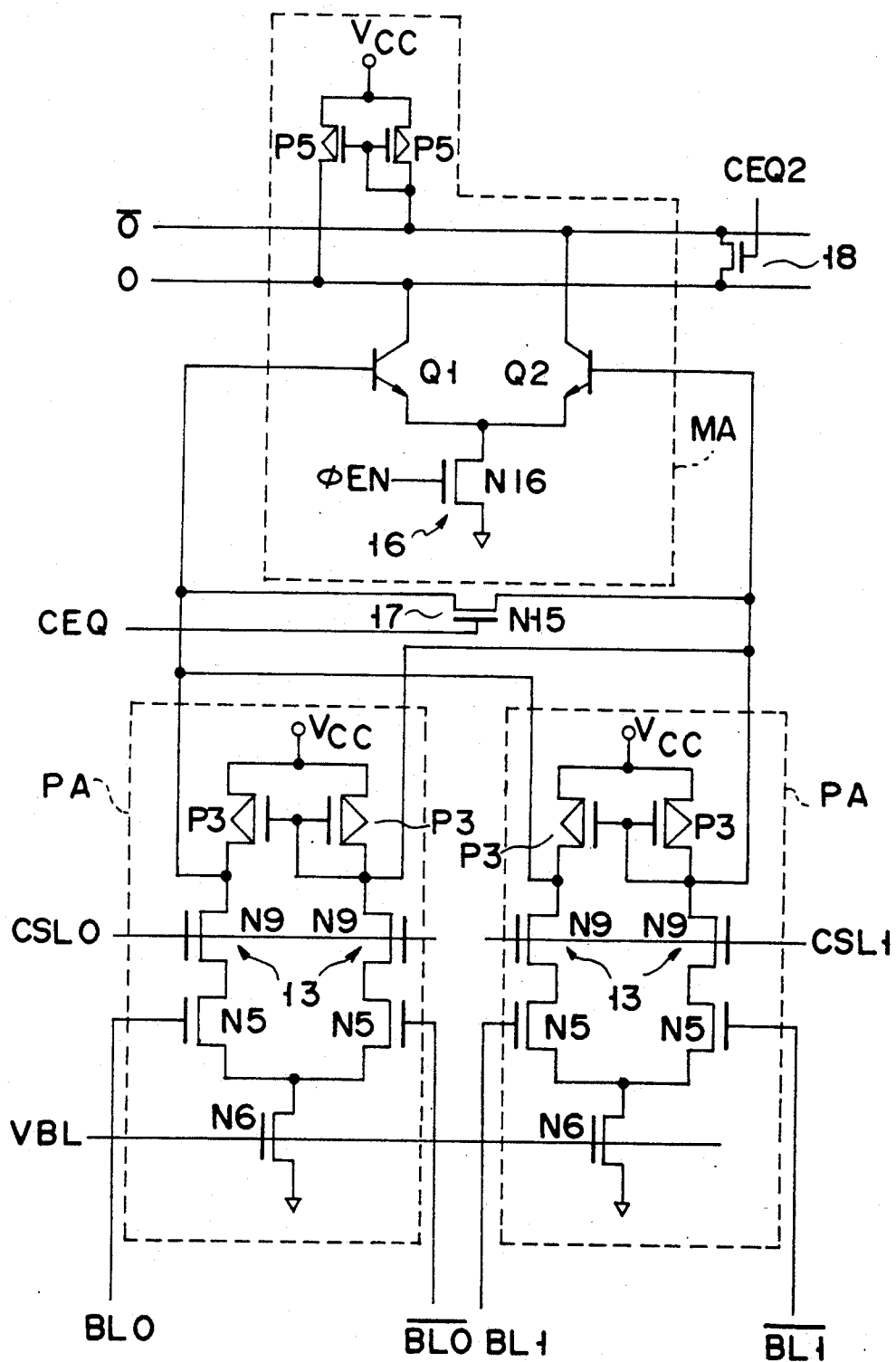
FIG. 8 is a schematic block diagram of a portion of a DRAM according to a second embodiment of the present invention.

FIG. 8 is a circuit diagram for a portion of a DRAM with a bit-line potential direct-read circuit according to a second embodiment of the present invention. For simplification's sake, memory cells, bit line pairs, word lines, and others are only limited to what is needed for an understanding of the present invention. The same parts in FIG. 8 and FIGS. 3 and 7 are indicated by the same reference characters.

This second-embodiment DRAM, unlike the first-embodiment DRAM, has no first precharge circuit 15. Additionally, the places to which the read amplifier activating circuit 16 and first equalize circuit 17 are connected are different from those in the first embodiment. Further, it differs from the first embodiment in that a second equalize circuit 18 is added to the common read buses O and $\overline{O}$.

Specifically, the preamplifier PA of the read amplifier is provided for each column (bit lines BL0 and $\overline{BL0}$ and BL1 and $\overline{BL1}$) of the memory cell array MCA. Between each NMOS transistor and each PMOS transistor constituting the preamplifier PA, an NMOS transistor N9 constituting the multiplexer 13 is connected. The main amplifiers MA are provided at a rate of one for ever two columns. This main amplifier, as shown in FIG. 7, is composed of a bipolar MOS differential amplifier consisting of a bipolar transistor and a MOS transistor. Between the bases of the transistors Q1 and Q2 serving as the input terminals for this main amplifier MA, the first equalize circuit 17 is connected. The PMOS transistors P5 acting as the load circuit of the main amplifier MA are connected to the common read bus O and $\overline{O}$ and are in common use by a plurality of read amplifiers.

The multiplexer 13, based on the column select signal CSLi (i=0, 1, 2, . . . ), selects one of the two columns, and then connects the output of a corresponding preamplifier PA to the input terminal of the main amplifier MA.

The read amplifier activating circuit 16, based on the activating signal $\phi$EN, selects some of a plurality of read amplifiers, and then activates their main amplifier MA. The first equalize circuit 17 selectively equalizes the potential of the output terminal of each preamplifier PA of the read amplifiers during the time other than read operations.

The second equalize circuit 18, during the time other than read operations, selectively equalizes the potential of the common read bus O and $\overline{O}$. Specifically, the second equalize circuit 18 is switched from on state to off state by the second equalize signal CEQ2 at the same time of or immediately after the activation of the word line and at the same time or a little later than the first equalize circuit 17 is switched from on to off state.

The preamplifier PA and main amplifier MA are activated at the same time or earlier than the activation of the word line. In addition, the individual equalize circuits 17 and 18 are switched from on to off state at the same time of or immediately after the activation of the word line.

In the second-embodiment DRAM, because the fundamental operations are the same as those of the first-embodiment DRAM, their detailed explanation will be omitted and most noticeable operations will be explained briefly.

It is assumed that with the column select signal CSL0 being at a high level and the column select signal CSL1 being at a low level, the selected word line is activated and the information in the memory cell appears on the bit line. In this case, the preamplifier PA on the side of the bit-line pair BL0 and $\overline{BL0}$ operates, but that on the side of the bit-line pair BL1 and $\overline{BL1}$ does not operate because the NMOS transistor N9 is off. Consequently, the information on the bit-line pair BL0 and $\overline{BL0}$ is supplied to the main amplifier MA. This information is amplified by the main amplifier MA activated by the activating signal $\phi$EN and then read onto the common read bus O and $\overline{O}$.

In the DRAM of the second embodiment, the read amplifier is composed of two stages of amplifiers with the capacitance of the common bit-line pair on the output side of preamplifier PA of this read amplifier smaller than that of the common read bus O and $\overline{O}$. As a consequence, sufficiently high-speed reading is possible as with the first-embodiment DRAM.

The second-embodiment DRAM has one main amplifier MA for every two columns, leaving more space than conventional ones. However, because it has more circuit elements than the first-embodiment DRAM, it is difficult to give the preamplifier a highly symmetrical layout. As a result, the second-embodiment DRAM has a slightly lower sensitivity than the first-embodiment DRAM.

Figure 9:
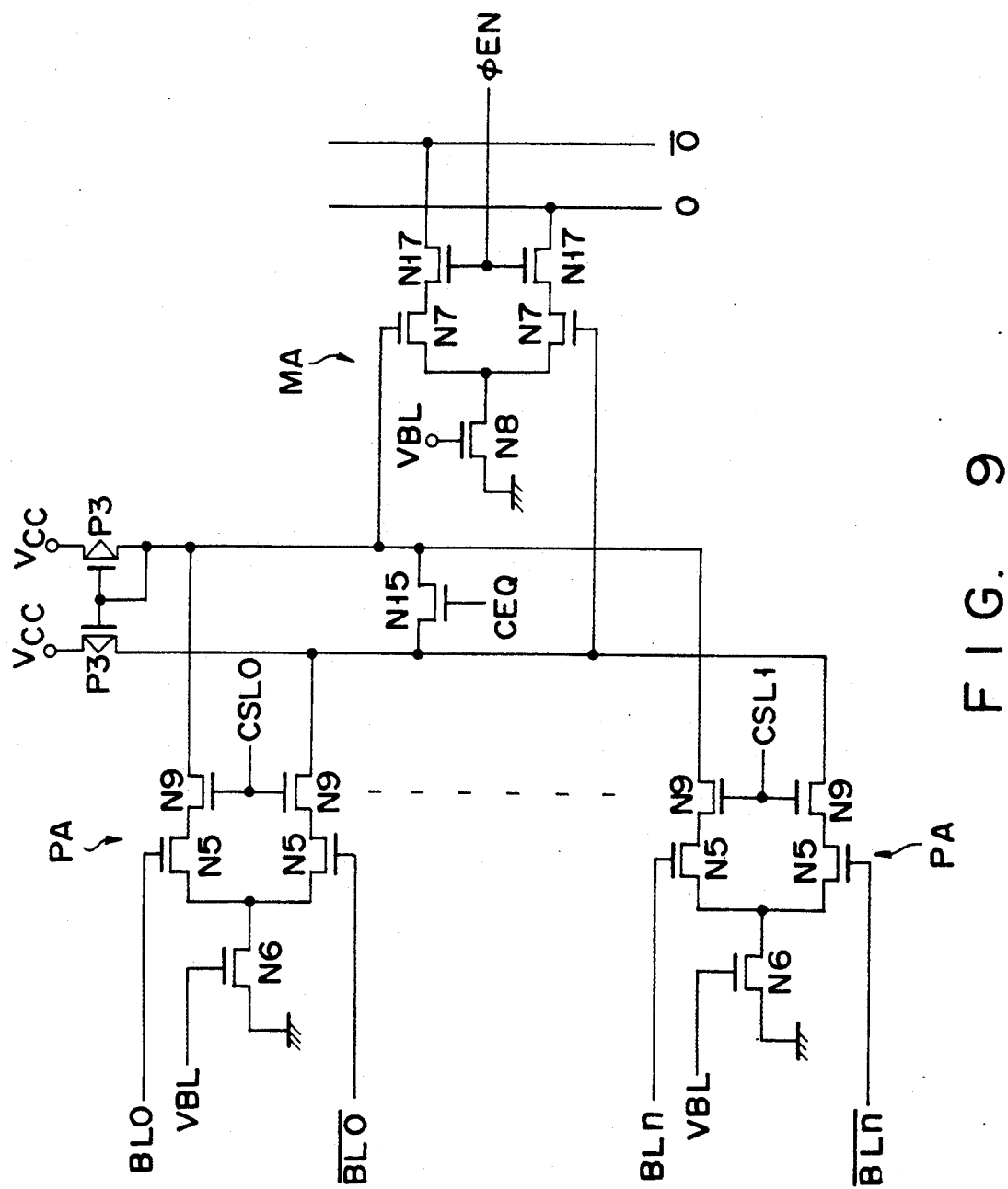
FIG. 9 is a circuit diagram for a modification of the read amplifier of FIG. 8.

FIG. 9 illustrates a modification of the DRAM according to the second embodiment. In the figure, the same parts as those in FIGS. 3 and 8 are indicted by the same reference characters.

In FIG. 9, a load circuit composed of PMOS transistors P3 of the preamplifier PA of a read amplifier is in common use by a plurality of read amplifiers. The main amplifier MA is made up of a current-mirror CMOS differential amplifier. Between the pair of NMOS driving transistors N7 of the main amplifier MA and the common read bus O and $\overline{O}$, a pair of activating control NMOS transistors N17 are connected, respectively. The NMOS transistor pair N17 is controlled by the activating signal $\phi$EN.

Figure 10:
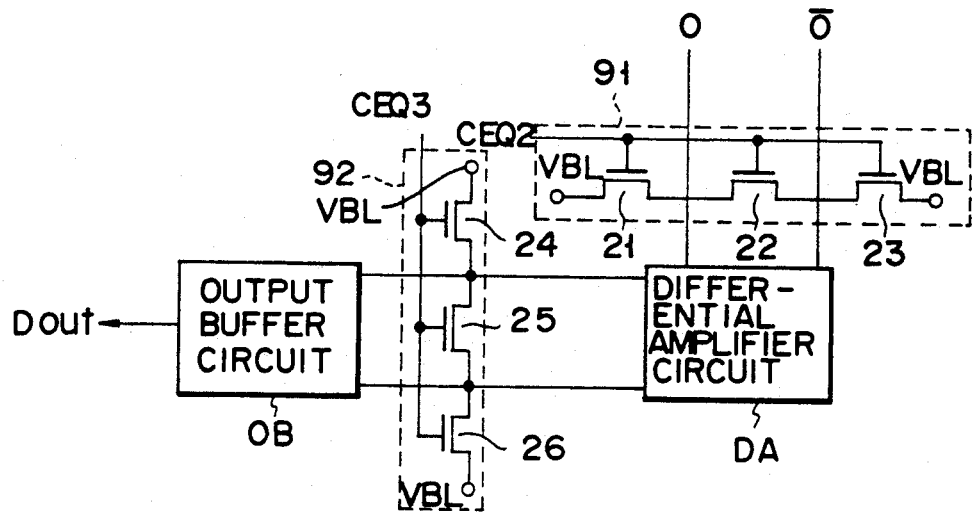
FIG. 10 is a circuit diagram for the output portion of an improvement of the DRAM of FIG. 2, especially the latter half beyond the common read bus.
Figure 11:
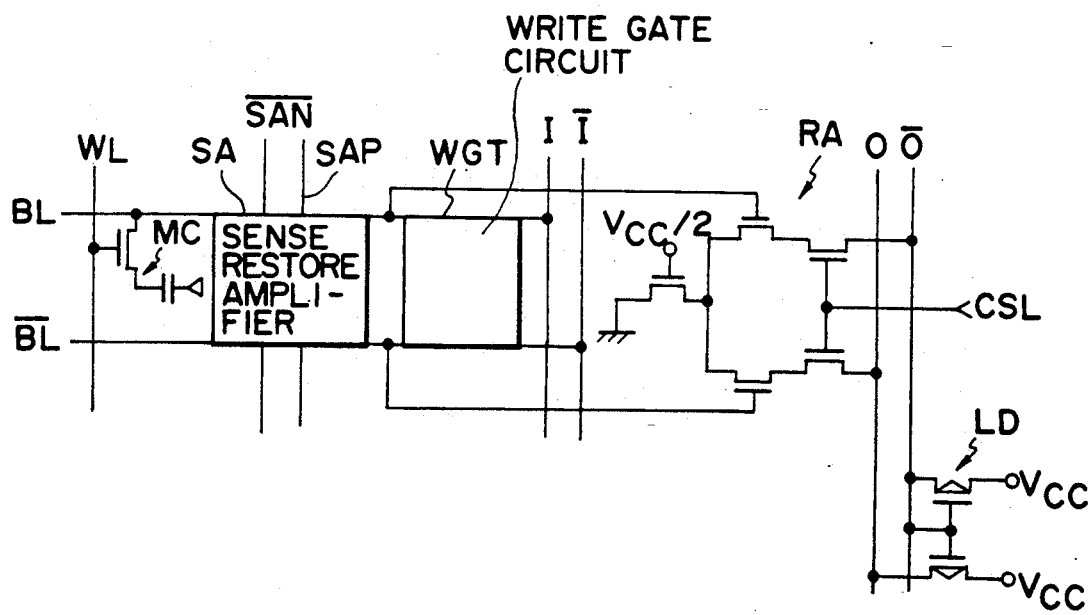
FIG. 11 is a schematic circuit diagram for a portion of a conventional bit-line potential direct-read circuit.
Figure 12:
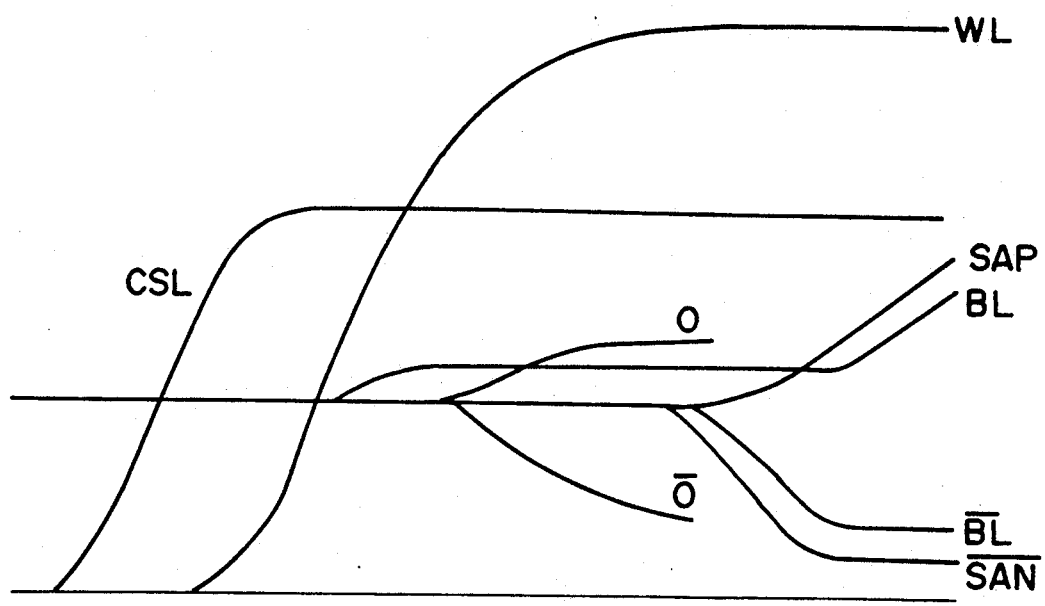
FIG. 12 is a timing diagram for a read operation in the DRAM of FIG. 11.

FIG. 10 illustrates an improvement of the DRAM of the first embodiment. Here, a second precharge equalize circuit 91 is connected to the common read bus O and $\overline{O}$ of FIG. 2, and a third precharge equalize circuit 92 is connected to the output terminals of a differential amplifier circuit DA for amplifying a signal on the bus.

The second precharge equalize circuit 91 is composed of an NMOS transistor N21 whose current path is connected between the common read bus O and the power supply VBL, an NMOS transistor N22 whose current path is connected across the common read bus O and $\overline{O}$, and an NMOS transistor N23 whose current path is connected between the common read bus $\overline{O}$ and the power supply VBL, with the gates of these NMOS transistors N21 through N23 supplied with the second precharge equalize signal CEQ2.

With this arrangement, the NMOS transistors N21 through N23, according to the second precharge equalize signal CEQ2, precharge and equalize the potential of the common read bus O and $\overline{O}$ to, for example, $V_{CC}/2$ during the time other than read operations. In this state, at the same time of or immediately after the activation of the word line WL, they are switched from on to off state in synchronization with or slightly later than the operation of the first equalize circuit (numeral 17 in FIG. 1).

The third precharge equalize circuit 92 is composed of an NMOS transistor N24 whose current path is connected between one output terminal of a differential circuit DA and the power supply VBL, an NMOS transistor N25 current path is connected across the two output terminals of the differential amplifier circuit DA, and an NMOS transistor N26 whose current path is connected between one output terminal of the differential amplifier circuit DA and the power supply VBL, with the gates of these NMOS transistors N24 through N26 supplied with the third precharge equalize signal CEQ3.

With this configuration, the NMOS transistors N24 through N26, according to the third precharge equalize signal CEQ3, precharge and equalize the potential of the output terminals of the bus-amplification differential amplifier DA to, for example, $V_{CC}/2$ during the time other than read operations. In this state, at the same time of or immediately after the activation of the word line, they are switched from on to off state in synchronization with or slightly later than the operation of the second equalize circuit 91.

That is, the individual equalize circuits 91 and 92 are switched from on to off state simultaneously or in the sequence of signal transfer.

The bus-amplification differential amplifier circuit DA is activated before or at the same time the word line is activated. As a result, the read start timing of the differential amplifier circuit DA is determined by the change of the second precharge equalize circuit 91 from on to off state.

In a case where a cascade connection of multiple stages of differential amplifier circuits is used, a fourth precharge equalize circuit (not shown) is provided between the individual differential amplifier circuits. The fourth precharge equalize circuit, according to the fourth precharge equalize signal, precharges and equalizes the potential between the complementary signal output terminals of the multiple differential amplifiers DA to, for example, $V_{CC}/2$ during the time other than read operations. In this state, at the same time of or immediately after the activation of the word line, it is switched from on to off state in synchronization with or slightly later than the operation of the second equalize circuit 91 and in synchronization with or slightly earlier than the operation of the third equalize circuit 92.

In the third-embodiment DRAM, because the fundamental operations are the same as those of the first-embodiment DRAM, their detailed explanation will be omitted and most noticeable operations will be explained briefly, referring to FIGS. 1 and 10.

Before a read operation starts, the bit line pair BLi and $\overline{BLi}$ (i=1, 2, 3, ...), and the common bit-line pair RBL and $\overline{RBL}$ and the common read bus 0 and $\overline{0}$ on the output side of the multiplexer 13 are all precharged to $V_{CC}/2$. It is assumed that before the word line is activated, all selected read amplifiers 12 and bus-amplification differential amplifier circuit DA are in the active state. In this case, the preamplifier PA of the read amplifier 12, which is supplied with $V_{CC}/2$ as the bit-line precharge voltage VBL, outputs an intermediate potential that is determined by the characteristics of the preamplifier PA. This intermediate potential is supplied to the main amplifier MA of the read amplifier 12, whose output is also at the intermediate potential. Therefore, it is obvious that previously setting those precharge voltages to a suitable value is desirable for high-speed operation. In the present embodiment, the circuit characteristics are set so that when the potential level $V_{CC}/2$ is supplied to the two terminals of the preamplifier PA and main amplifier MA of the read amplifier 12 and the bus-amplification differential amplifier circuit DA, each of these amplifiers may supply the output of $V_{CC}/2$. The precharge voltage at the read common bus O and $\overline{O}$ and the output side of the bus-amplification differential amplifier circuit DA is also set to $V_{CC}/2$.

Because the third-embodiment DRAM is constructed by adding the second and third precharge equalize circuits 91 and 93 to the first-embodiment DRAM, the former can read data faster than the latter.

Even when a DRAM with a bit-line potential direct-read circuit has a differential read amplifier consisting only of preamplifiers for each column of the memory cell array, or even when it has a differential read amplifier consisting only of preamplifiers shared by a plurality of columns, it still assures high-speed reading.

Specifically, to activate the read amplifier at the same time or before the word line is activated and amplify a signal appearing on the bit lines immediately after the activation of the word line with the read amplifier without a delay, an equalize circuit is provided which selectively equalizes the potential between the output terminals that supply complementary signals. By switching this equalize circuit from on to off state at the same time or after the word line is activated, it is possible to prevent an imbalance in the potential between the output terminals of the read amplifier from being amplified, thereby ensuring high-speed reading.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor memory device comprising:
   a memory cell array in which dynamic memory cells are placed at some of the intersections of a plurality of bit line pairs and a plurality of word lines;
   a row decoder for selecting a word line of said memory cell array;
   a column decoder for supplying a column select signal to select a column (a bit line pair) of said memory cell array;
   bit-line precharge equalize circuits connected to the individual columns of said memory cell array, respectively, which, based on a precharge equalize signal, precharge and equalize the bit line pair to a specified potential for a particular period of time;
   restore sense amplifiers connected to the individual columns of said memory cell array, respectively, which restore information in the memory cell;
   write gate circuits provided for the individual columns of said memory cell array, respectively, which are each selected by a column select signal from said column decoder;
   a write data line pair connected in common to said write gate circuits, which transfers information to be written;
   a plurality of read amplifiers provided at a rate of one for every particular number of columns of said memory cell array, each of which is composed of a plurality of differential amplifiers connected in cascade;
   a read data line pair connected in common to the individual final-stage output sections of said read amplifiers;
   a multiplexer that, based on a column select signal from said column decoder, selects one of said columns and then connects it to a corresponding read amplifier;

a first precharge circuit connected to the output side of said multiplexer, which is selectively turned on by a first precharge signal, and precharges the signal line pair on the output side of said multiplexer to a specified potential during the time other than read operations;

a control signal generating circuit the output terminal of which is connected to said first precharge circuit and said read amplifier, and which, according to said column select signals, not only selectively deactivates said first precharge signal, but also produces a control signal to activate said read amplifier; and a read amplifier activating circuit provided for said read amplifier, which, based on the control signal from said control signal generating circuit, activates said read amplifier.

2. A semiconductor memory device according to claim 1, wherein said read amplifier is composed of a preamplifier and a main amplifier each consisting of a CMOS differential amplifier with a current-mirror load, the preamplifier being connected to a MOS transistor constituting said read amplifier activating circuit, and the current-mirror load of the main amplifier being in common use by a plurality of read amplifiers.

3. A semiconductor memory device according to claim 2, wherein said preamplifier has complementary output terminals connected to the input terminals of said main amplifier and a first equalize circuit, which equalizes the potential of the output terminals of said preamplifier on the basis of a first equalize signal, is connected across these output terminals.

4. A semiconductor memory device according to claim 1, wherein said read amplifier is a differential amplifier composed of a preamplifier constituted by a CMOS differential amplifier with a current-mirror load and a main amplifier constituted by a bipolar transistor with a current-mirror load made up of a MOS transistor, the current-mirror load of the main amplifier being in common use by a plurality of read amplifiers.

5. A semiconductor memory device according to claim 4, wherein said memory cell array constitutes a block and a write/read circuit, which includes said restore sense amplifiers, write gate circuits, read amplifiers, multiplexers, first precharge circuits, control signal generating circuits, read amplifier activating circuits and first equalize circuits, constitutes a block, with a plurality of memory cell array blocks and write/read circuit blocks arranged alternately.

6. A semiconductor memory device according to claim 5, wherein said write data line pair is connected in common to a plurality of write gate circuits in a block of said write/read circuit, and said read data line pair is connected in common to a plurality of read amplifiers in a block of said write/read circuit.

7. A semiconductor memory device according to claim 5, wherein said control signal generating circuit is composed of a logic circuit that ANDs the OR of said column select signals with the block select signal generated from the output signal of said row decoder to select said block and then produces said control signal.

8. A semiconductor memory device according to claim 5, wherein said memory cell array blocks and said write/read circuit blocks are arranged alternately and said row decoder is placed along one longitudinal side of this block arrangement, while said column decoder is placed along one lateral side of the same arrangement, one of said write/read circuit blocks it selected based on the block select signal.

9. A semiconductor memory device according to claim 8, wherein said write data line pair, read data line pair, block select signal line for transferring said block select signal, and equalize signal line for transferring said first equalize signal are all provided in parallel with said word line in a block constituting said write/read circuit, and the column select signal line for transferring said column select signal is provided at right angles to said word line in a block constituting said memory circuit.

10. A semiconductor memory device according to claim 4, wherein said preamplifier has a first and second input terminals to which the bit line pair of each column is connected, respectively, and a first and second output terminals that are connected to the input terminals of said main amplifier, respectively, with a first capacitor connected between said first input terminal and second output terminal and a second capacitor connected between said second input terminal and first output terminal.

11. A semiconductor memory device comprising:
a memory cell array in which dynamic memory cells are placed at some of the intersections of a plurality of bit line pairs and a plurality of word lines;
a row decoder for selecting a word line of said memory cell array;
a column decoder for supplying a column select signal to select a column (a bit line pair) of said memory cell array;
bit-line precharge equalize circuits connected to the individual columns of said memory cell array, respectively, which, based on a precharge equalize signal, precharge and equalize the bit line pair to a specified potential for a particular period of time;
restore sense amplifiers connected to the individual columns of said memory cell array, respectively, which restore information in the memory cell;
write gate circuits provided for the individual columns of said memory cell array, respectively, which are each selected by a column select signal from said column decoder;
a write data line pair connected in common to said write gate circuits, which transfers information to be written;
a plurality of read amplifiers provided at a rate of one for every particular number of columns of said memory cell array, each of which is composed of a plurality of first amplifiers and a second amplifier connected in common to these first amplifiers, the first amplifiers being connected to the individual columns, respectively;
a read data line pair connected in common to the individual final-stage output sections of said read amplifiers;
a multiplexer provided for the first amplifier, which, based on a column select signal from said column decoder, selects said first amplifiers and connects them to a corresponding second amplifier;
a control signal generating circuit connected to said read amplifier, which, according to said column select signals, produces a control signal to activate said read amplifier; and
a read amplifier activating circuit provided for said second amplifier, which, based on said control signal, selects some of said read amplifiers and then selectively activates their second amplifier; and a first equalize circuit provided in common for the output terminals of said first amplifiers that supply complementary signals, which equalizes the potential of the output terminals of said first amplifier during the time other than read operations.

12. A semiconductor memory device according to claim 11, wherein said first amplifier is a CMOS differential amplifier with a current-mirror load, and a second amplifier is a differential amplifier consisting of a bipolar transistor with a current-mirror load made up of a MOS transistor, the current-mirror load of the second amplifier being in common use by a plurality of read amplifiers.

13. A semiconductor memory device according to claim 11, wherein the timing with which said read amplifier activating circuit activates said read amplifier is before or at the same time said word line is activated.

14. A semiconductor memory device according to claim 11, wherein the timing with which said first equalize circuit is switched from on to off is at the same time or immediately after said word line is activated.

15. A semiconductor memory device according to claim 11, wherein the timing with which said restore sense amplifier is activated is at the same time or later than said first equalize circuit is turned off.

16. A semiconductor memory device according to claim 12, wherein said read data line pair further contains a second precharge equalize circuit that precharges and equalizes said read data line pair to a specified potential during the time other than read operations.

17. A semiconductor memory device according to claim 16, wherein the timing with which said second precharge equalize circuit is switched from on to off state is at the same time or immediately after said word line is activated, and at the same time or immediately after said first precharge equalize circuit is switched from on to off state.

18. A semiconductor memory device according to claim 16, further comprising a differential amplifier circuit connected to said read data line pair, whose output terminals are provided with a third precharge equalize circuit that precharges and equalizes the output terminals of this differential amplifier circuit to a specified potential during the time other than read operations.

19. A semiconductor memory device according to claim 18, wherein said differential amplifier is activated before or at the same time said word line is activated, and the timing with which said third equalize circuit is switched from on to off state is at the same time or immediately after said word line is activated, and at the same time or immediately after said second precharge equalize circuit is switched from on to off state.

20. A semiconductor memory device according to claim 16, wherein the potential precharged by said first precharge circuit, and said second, and third precharge equalize circuits is an intermediate potential between the power supply potential applied to the semiconductor memory device and the ground potential.

21. A semiconductor memory device according to claim 20, wherein said intermediate potential is a half of said power supply potential.

22. A semiconductor memory device comprising:
a memory cell array in which dynamic memory cells are placed at some of the intersections of a plurality of bit line pairs and a plurality of word lines;
a row decoder for selecting a word line of said memory cell array;
a column decoder for supplying a column select signal to select a column (a bit line pair) of said memory cell array;
bit-line precharge equalize circuits connected to the individual columns of said memory cell array, respectively, which, based on a precharge equalize signal, precharge and equalize the bit line pair to a specified potential for a particular period of time;
restore sense amplifiers connected to the individual columns of said memory cell array, respectively, which restore information in the memory cell;
write gate circuits provided for the individual columns of said memory cell array, respectively, which are each selected by a column select signal from said column decoder;
a write data line pair connected in common to said write gate circuits, which transfers information to be written;
a plurality of read amplifiers provided at a rate of one for every particular number of columns of said memory cell array, each of which is composed of a plurality of first amplifiers and a second amplifier connected in common to these first amplifiers connected respectively to the individual columns;
a read data line pair connected in common to the individual final-stage output sections of said read amplifiers;
a multiplexer provided for the first amplifier, which, based on a column select signal from said column decoder, selects said first amplifiers and then connects them to a corresponding second amplifier;
a control signal generating circuit connected to said read amplifier, which, according to said column select signals, produces a control signal to activate said read amplifier;
a read amplifier activating circuit provided for said second amplifier, which, based on said control signal, selects some of said read amplifiers and then selectively activates their second amplifier; and
a first equalize circuit provided in common for the output terminals of said first amplifiers that supply complementary signals, which equalizes the potential of the output terminals of said first amplifier during the time other than read operations; wherein
said second amplifier is composed of a CMOS differential amplifier with a current-mirror load circuit, said first amplifier is composed of a CMOS differential amplifier with a current-mirror load, and said load circuit is in common use by a plurality of first amplifiers.

* * * * *